(12) United States Patent
Hershman et al.

(10) Patent No.: US 9,523,736 B2
(45) Date of Patent: Dec. 20, 2016

(54) DETECTION OF FAULT INJECTION ATTACKS USING HIGH-FANOUT NETWORKS

(71) Applicant: Nuvoton Technology Corporation, Hsin-chu (TW)

(72) Inventors: Ziv Hershman, Givat Shmuel (IL); Leonid Shamis, Raanana (IL); Natan Keren, Beer Sheva (IL)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 14/308,723

(22) Filed: Jun. 19, 2014

(65) Prior Publication Data

US 2015/0369865 A1 Dec. 24, 2015

(51) Int. Cl.
*G01R 31/317* (2006.01)
*H03K 19/003* (2006.01)

(52) U.S. Cl.
CPC ....... *G01R 31/31719* (2013.01); *H03K 19/003* (2013.01)

(58) Field of Classification Search
CPC ...... G01R 31/31719; G06F 21/75; G06F 1/10; G06F 21/558; G06F 2221/2105; G06K 19/07309
USPC ...................... 326/93–98; 327/176, 291–299
See application file for complete search history.

(56) References Cited

U.S. PATENT DOCUMENTS

| | | | |
|---|---|---|---|
| 4,860,288 A | 8/1989 | Teske et al. | |
| 5,867,409 A | 2/1999 | Nozuyama | |
| 6,154,045 A | * 11/2000 | Ye | H03K 5/04 326/17 |
| 6,735,732 B2 | 5/2004 | Yamada | |
| 6,844,761 B2 | 1/2005 | Byun et al. | |
| 7,702,992 B2 | 4/2010 | Ogawa | |
| 7,770,049 B1 | 8/2010 | Searles et al. | |

(Continued)

FOREIGN PATENT DOCUMENTS

| | | | | |
|---|---|---|---|---|
| CN | 101192820 A | 6/2010 | | |
| KR | 101352149 B1 | * 1/2014 | | 326/8 |
| KR | 101352149 B1 | 1/2014 | | |

OTHER PUBLICATIONS

TW Application # 103140005 Office Action dated Nov. 25, 2015.

(Continued)

*Primary Examiner* — Alexander H Taningco
*Assistant Examiner* — Seokjin Kim
(74) *Attorney, Agent, or Firm* — D, Kligler IP Services Ltd.

(57) ABSTRACT

An apparatus for detecting fault injection includes a high-fanout network, which spans an Integrated Circuit (IC), and circuitry. In some embodiments, the high-fanout network is continuously inactive during functional operation of the IC, and the circuitry is configured to sense signal levels at multiple sampling points in the high-fanout network, and to identify a fault injection attempt by detecting, based on the sensed signal levels, a signal abnormality in the high-fanout network. In some embodiments, the circuitry is configured to sense signal levels at multiple sampling points in the high-fanout network, to distinguish, based on the sensed signal levels, between legitimate signal variations and signal abnormalities in the high-fanout network during functional operation of the IC, and to identify a fault injection attempt by detecting a signal abnormality.

18 Claims, 2 Drawing Sheets

(56) References Cited

U.S. PATENT DOCUMENTS

| | | |
|---|---|---|
| 8,542,177 B2 | 9/2013 | Lee |
| 2005/0235179 A1 | 10/2005 | Pistoulet |
| 2007/0075746 A1 | 4/2007 | Fruhauf et al. |
| 2008/0284483 A1 | 11/2008 | Nakashima |
| 2009/0315603 A1 | 12/2009 | Bancel et al. |
| 2011/0029828 A1* | 2/2011 | Bancel et al. ............... 714/724 |
| 2011/0234307 A1* | 9/2011 | Marinet et al. ............... 327/538 |
| 2013/0099844 A1 | 4/2013 | Kawaoka |
| 2013/0113572 A1 | 5/2013 | Sharda et al. |
| 2013/0305078 A1 | 11/2013 | Lee et al. |
| 2014/0075255 A1 | 3/2014 | Lee et al. |
| 2014/0219406 A1 | 8/2014 | Chen et al. |
| 2015/0121327 A1 | 4/2015 | Kamal et al. |
| 2015/0269298 A1 | 9/2015 | Dai et al. |
| 2015/0280722 A1 | 10/2015 | Liu et al. |
| 2015/0323959 A1 | 11/2015 | Arabi |
| 2016/0028381 A1 | 1/2016 | Tasher |
| 2016/0028394 A1 | 1/2016 | Tasher et al. |

OTHER PUBLICATIONS

European Application # 14179703.5 Search Report dated Feb. 13, 2015.
U.S. Appl. No. 14/337,257 Office Action dated Feb. 22, 2016.
U.S. Appl. No. 14/752,944 Office Action dated Dec. 9, 2015.
U.S. Appl. No. 14/752,944 Office Action dated Mar. 16, 2016.

* cited by examiner

DETECTION OF FAULT INJECTION ATTACKS USING HIGH-FANOUT NETWORKS

FIELD OF THE INVENTION

The present invention relates generally to protection of electronic circuitry, and particularly to methods and systems for detecting fault injection attacks.

BACKGROUND OF THE INVENTION

Fault injection attacks are a family of techniques used for accessing, analyzing or extracting information from secure electronic circuitry, such as cryptographic circuitry. A fault injection attack typically involves causing a fault in the circuit, e.g., by physically contacting signal lines, by applying high-power laser or electromagnetic pulses, or by causing glitches on power supply or other external interfaces. The fault is expected to cause the circuit to output sensitive information, or otherwise assist the attacker in penetrating the circuit or the information it stores.

Various techniques for detecting and mitigating fault injection attacks are known in the art. For example, U.S. Patent Application Publication 2011/0029828, whose disclosure is incorporated herein by reference, describes a circuit for detecting a fault injection in an integrated circuit. The circuit includes at least one logic block for performing a logic function of the integrated circuit; an isolation block coupled to receive a signal to be processed and an isolation enable signal indicating a functional phase and a detection phase of the logic block. The isolation block applies, during the functional phase, the signal to be processed to at least one input of the logic block, and during the detection phase, a constant value to the input of the logic block. A detection block is adapted to monitor, during the detection phase, the state of the output signal of the logic block, and to generate an alert signal in case of any change in the state of the output signal.

U.S. Patent Application Publication 2007/0075746, whose disclosure is incorporated herein by reference, describes techniques for glitch detection in a secure microcontroller. An apparatus includes a plurality of macro-cells formed from logic capable of performing one or more functions. The apparatus also includes a clock tree capable of receiving a clock signal and providing at least one copy of the clock signal to each macro-cell. The clock tree includes a local branch within each macro-cell, where each local branch is capable of providing at least one copy of the clock signal. In addition, the apparatus includes at least one glitch detection circuit capable of detecting a glitch in one or more copies of the clock signal provided by the local branches in the macro-cells.

U.S. Patent Application Publication 2009/0315603, whose disclosure is incorporated herein by reference, describes techniques for detecting a disturbance of a state of at least one first flip-flop from a group of several first flip-flops of an electronic circuit. The respective outputs of the first flip-flops in the group are, independently from their functional purpose, combined to provide a signal and its inverse, triggering two second flip-flops having data inputs forced to a same state, the respective outputs of the second flip-flops being combined to provide the result of the detection. A pulse signal comprising a pulse at least for each triggering edge of one of the first flip-flops in the group initializes the second flip-flops.

U.S. Patent Application Publication 2005/0235179, whose disclosure is incorporated herein by reference, describes a device for protection against error injection into a synchronous flip-flop of an elementary logic module. A logic circuit comprises a logic module comprising a functional synchronous flip-flop receiving a functional result comprising several bits in parallel, and supplying a synchronous result. A module for checking the integrity of the functional flip-flop comprises a first coding block receiving the functional result and supplying a first code, a second coding block receiving the synchronous result and supplying a second code, a checking synchronous flip-flop receiving the first code and supplying a third code, and a comparator for comparing the second code with the third code and for supplying a first error signal.

Korean Patent Application Publication KR101352149B, whose disclosure is incorporated herein by reference, describes a circuit for detecting optical fault injection using a buffer in a reset signal path, capable of detecting optical fault injection using buffers existing in a reset signal line required for resetting a chip. The circuit includes a plurality of detection units formed in a path of a reset signal which is transmitted to each flip-flop comprising a digital circuit for detecting external optical fault injection, a signal collection unit for collecting outputs of the detection units into one and distinguishing a change when a change in signals of any of the detection units is occurred, and a detection signal generation unit for detecting a signal change outputted from the detection units and generating an optical fault injection detection signal by an input of the signal collection unit.

SUMMARY OF THE INVENTION

An embodiment of the present invention that is described herein provides an apparatus for detecting fault injection, including a high-fanout network and circuitry. The high-fanout network spans an Integrated Circuit (IC) and is continuously inactive during functional operation of the IC. The circuitry is configured to sense signal levels at multiple sampling points in the high-fanout network, and to identify a fault injection attempt by detecting, based on the sensed signal levels, a signal abnormality in the high-fanout network.

In some embodiments, one or more electronic components are inserted in the high-fanout network, the electronic components have a first sensitivity for transitioning to an inactive state, and a second sensitivity, higher than the first sensitivity, for transitioning to an active state. In an embodiment, the high-fanout network includes a test signal network. In a disclosed embodiment, the circuitry includes at least one sensor that is configured to sense the signal levels at two or more of the sampling points, and to consolidate the sensed signal levels so as to produce a respective sensor output.

In another embodiment, the circuitry is configured to compare two or more of the sensed signal levels to one another, and to detect the signal abnormality by detecting a difference between the compared signal levels. Typically, the circuitry is configured to continuously sense the signal levels and identify the fault injection attempt while the IC operates in a normal operation mode.

In an example embodiment, the circuitry is configured to receive at least one input from other detection logic in the IC. In another embodiment, in response to identifying the fault injection attempt, the circuitry is configured to provide at least one output to another alert mechanism in the IC. In yet another embodiment, in response to identifying the fault injection attempt, the circuitry is configured to modify one or more of the signal levels in the high-fanout network.

There is additionally provided, in accordance with an embodiment of the present invention, an apparatus for detecting fault injection including a high-fanout network and circuitry. The high-fanout network spans an Integrated Circuit (IC). The circuitry is configured to sense signal levels at multiple sampling points in the high-fanout network, to distinguish, based on the sensed signal levels, between legitimate signal variations and signal abnormalities in the high-fanout network during functional operation of the IC, and to identify a fault injection attempt by detecting a signal abnormality.

In some embodiments, one or more electronic components are inserted in the high-fanout network, the electronic components have a first sensitivity for transitioning to an inactive state, and a second sensitivity, higher than the first sensitivity, for transitioning to an active state. In some embodiments, the high-fanout network includes a slow toggling network. In an embodiment, the circuitry includes at least one sensor that is configured to sense the signal levels at two or more of the sampling points, and to consolidate the sensed signal levels so as to produce a respective sensor output.

In an embodiment, the circuitry is configured to compare two or more of the sensed signal levels to one another, and to detect the signal abnormality by detecting a difference between the compared signal levels. In another embodiment, the circuitry is configured to identify one or more time intervals during which the signal levels in the high-fanout network are expected to be stable, and to detect the signal abnormality only during the identified time intervals.

In a disclosed embodiment, the circuitry is configured to receive at least one input from other detection logic in the IC. In an embodiment, in response to identifying the fault injection attempt, the circuitry is configured to provide at least one output to another alert mechanism in the IC. In another embodiment, in response to identifying the fault injection attempt, the circuitry is configured to modify one or more of the signal levels in the high-fanout network. In some embodiments, the circuitry is configured to detect the signal abnormality by detecting a glitch on at least one of the sensed signal levels.

There is also provided, in accordance with an embodiment of the present invention, a method for detecting fault injection. Signal levels are sensed at multiple sampling points in a high-fanout network, which spans an Integrated Circuit (IC) and which is continuously inactive during functional operation of the IC. A fault injection attempt is identified by detecting, based on the signal levels sensed at the multiple sampling points, a signal abnormality in the high-fanout network.

There is further provided, in accordance with an embodiment of the present invention, a method for detecting fault injection. Signal levels are sensed at multiple sampling points in a high-fanout network that spans an Integrated Circuit (IC). Based on the sensed signal levels, legitimate signal variations are distinguished from signal abnormalities in the high-fanout network during functional operation of the IC. A fault injection attempt is identified by detecting a signal abnormality.

The present invention will be more fully understood from the following detailed description of the embodiments thereof, taken together with the drawings in which:

DETAILED DESCRIPTION OF EMBODIMENTS

Overview

Figure 1:
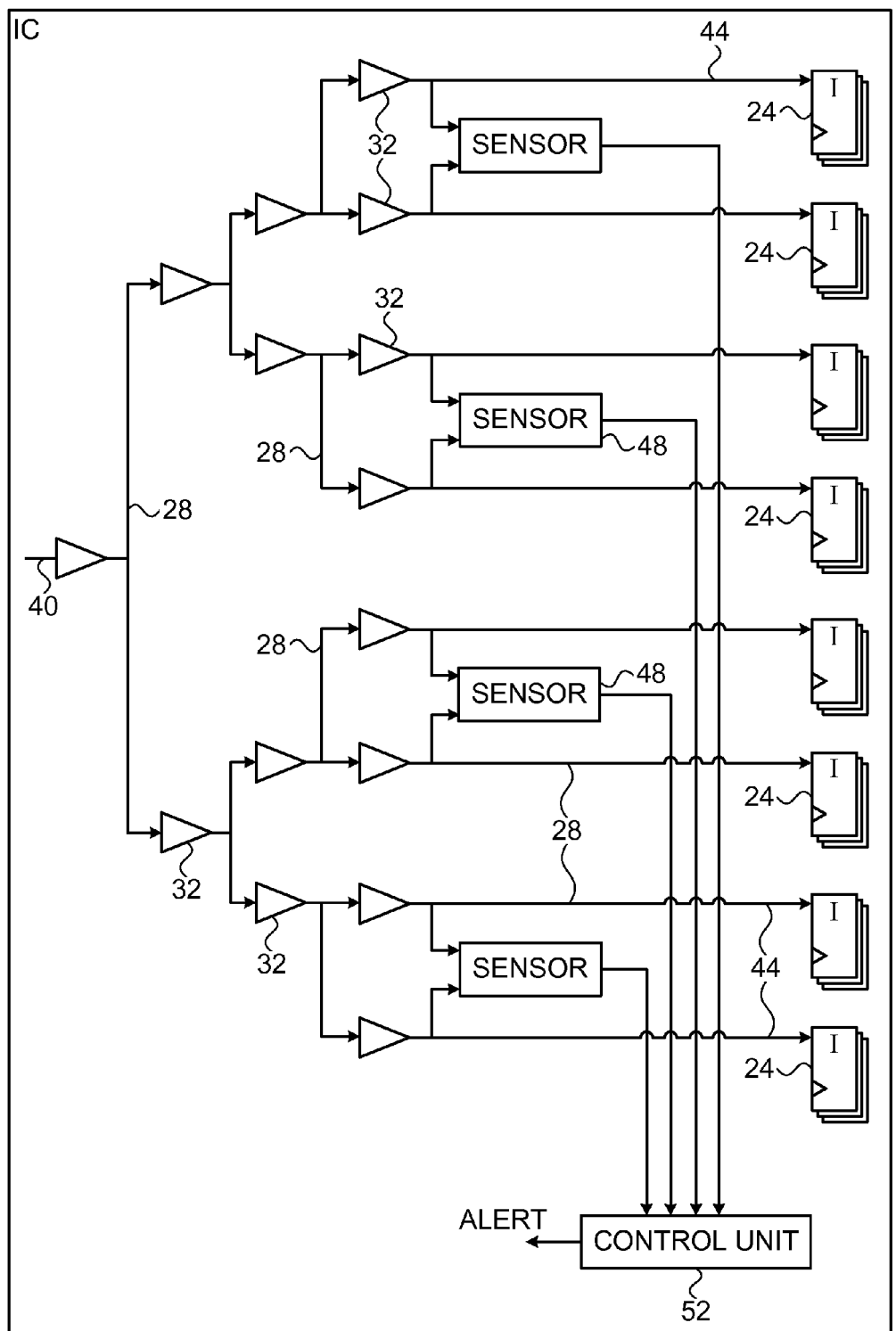
FIG. 1 is a block diagram that schematically illustrates a secure Integrated Circuit (IC), in accordance with an embodiment of the present invention.

Embodiments of the present invention that are described herein provide improved methods and systems for detecting and mitigating fault injection attacks on Integrated Circuits (ICs). The disclosed techniques detect fault injection attempts by sensing the signal on a high-fanout network, such as a scan-enable signal network, which spans large portions of the IC.

In an example implementation, multiple sensors are coupled to respective sampling points along a high-fanout network that spans the IC. A control unit collects and processes the sensor outputs, so as to detect signal abnormalities on the high-fanout network. Upon detecting an abnormality that is suspected of indicating a fault injection attempt, the control unit triggers an alert or takes some protective action.

In some embodiments, the chosen high-fanout network distributes a signal that is continuously and unconditionally inactive during normal functional operation of the IC. One example is a scan-enable signal (also referred to as scan-shift), which is active only during testing and not during normal operation. Since this sort of high-fanout network is constantly inactive, any detected abnormality is highly suspicious of a fault injection attempt. Using such high-fanout networks enables reliable detection during normal operation without switching to a dedicated fault detection mode. Fault detection can be performed at any time, even when the IC or parts thereof undergo reset events, as long as the detection circuits of the IC remain active.

In other disclosed embodiments, the chosen high-fanout network distributes a signal that varies over time during normal functional operation of the IC. One example is an active-shield signal. In these embodiments, the control unit distinguishes between legitimate variations of the signal and variations that are suspected of indicating a fault injection attempt. For example, the control network may look for abnormalities during time intervals in which the high-fanout network is expected to be stable, or compare the outputs of two or more sensors that sense network branches.

As noted above, the disclosed techniques look for abnormalities during normal operation of the IC, without needing to control the inputs of these circuits, for example, by switching to a dedicated fault detection mode. As such, protection from fault injection is given when it is most needed, e.g., while sensitive information is being manipulated. Since the high-fanout network spans a large portion of the IC, the disclosed techniques are able to detect fault injection attempts with high likelihood. By making use of an existing high-fanout network that is part of the functional design of the IC, broad coverage of the IC area can be achieved with minimal addition of hardware and minimal power consumption.

Several example implementations of the disclosed techniques are described herein. Complementary techniques, such as designing junctions of the high-fanout network in an imbalanced manner that makes them sensitive to fault injection, are also described.

System Description

FIG. 1 is a block diagram that schematically illustrates elements of a secure Integrated Circuit (IC) 20, in accordance with an embodiment of the present invention. IC 20 may comprise, for example, a microprocessor, a memory device or any other suitable type of IC.

IC 20 comprises functional circuitry, i.e., circuit components that carry out the designated functions of the IC. In the example of FIG. 1, the functional circuitry comprises multiple Flip-Flops (FFs) 24. These FFs represent the functional cells, connected to the high-fanout network leaves (the term "leaves" refers to network terminal branches or wires) and are depicted in a highly simplified manner for the sake of example. Note that although in this figure all FFs are connected to network leaves, FFs can also be connected to non-leaf network branches. Alternatively, the functional circuitry may comprise any other suitable components.

IC 20 further comprises a high-fanout network that spans across a large portion of the IC area. In the context of the present patent application and in the claims, the term "high-fanout network" refers to a network of signal traces that distributes a given signal to multiple components at multiple locations in the IC.

The high-fanout network may comprise buffers, inverters or repeaters for maintaining signal integrity in addition to traces, as well as other suitable types of logic cells that are equivalent to buffers or inverters whenever the network is checked. Logically, however, e.g., at the Register Transfer Level (RTL) description or simulation level, in operational mode, a high-fanout network is equivalent to a wire or inverter and does not execute any kind of logic beside inversion. A high-fanout network may comprise, for example, a scan enable signal network that distributes a test signal, an active-shield network that distributes a shield voltage or current over a conducting layer disposed above the IC circuitry, a reset signal network that distributes a reset signal to multiple locations in the IC, or any other suitable type of high-fanout signal.

In the example of FIG. 1, the high-fanout network distributes a signal that is applied at a root 40. The signal is distributed to multiple functional components of the IC, in the present example as input to multiple FFs 24. Each endpoint 44 of the high-fanout network is also referred to as a leaf. The high-fanout network in FIG. 1 comprises conductive traces 28 (also referred to as branches; note that leaf is also a branch), and inverters, buffers or repeaters 32.

In some embodiments, IC 20 comprises circuitry for detecting or latching fault injection attempts. In the example of FIG. 1, IC 20 comprises multiple sensors 48 (e.g., flip-flops, latches, edge-detectors, glitch-detectors, OR gates, AND gates, XOR gates, registers or a combination thereof) that sense the high-fanout network at multiple respective sampling points. Each sensor 48 senses the signal (e.g., voltage or current) at the respective sampling point, and produces a corresponding output. The sampling points are typically distributed across the IC area, so as to achieve maximum detection coverage.

In some embodiments, a given sensor 48 senses two or more sampling points via some consolidating logic. For an active-high network, for example, the consolidating logic may perform a logical OR function using one or more OR gates or an OR tree.

The outputs of sensors 48 are provided to a control unit 52. The control unit combines or otherwise processes the sensor outputs, so as to detect signal abnormalities that are indicative of fault injection attempts, as will be explained in greater detail below. Upon detecting a fault injection attempt, control unit 52 may trigger an alert. Additionally or alternatively, the control unit may take some protective action upon detecting a fault injection attempt, e.g., shut down at least part of the IC, or retain at least part of the IC in a reset condition.

The IC configuration of FIG. 1 is an example configuration, which is shown purely for the sake of conceptual clarity. In alternative embodiments, any other suitable IC configuration can also be used. Elements that are not necessary for understanding the principles of the present invention, such as various interfaces, control circuits, addressing circuits, timing and sequencing circuits and debugging circuits, have been omitted from the figure for clarity. The various IC elements may be implemented in hardware, in software, or using a combination of hardware or software elements.

In some embodiments, control unit 52 is implemented using a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, for example when control unit 52 is implemented in hardware, the control unit 52 may be integrated with one or more of sensors 48. One example of such integration is having a certain sensor 48 latch a network abnormality event and directly assert an ALERT signal in response. One or more such ALERT signals can then be maintained, each potentially connected to attack countermeasure logic, thereby eliminating the need for a separate control unit 52. Thus, in the context of the present patent application and in the claims, control unit 52 and sensors 48 are referred to collectively as circuitry that carries out the disclosed techniques. The circuitry may be divided into structural or functional units in any suitable way.

In yet another embodiment, one or more of the outputs of sensors 48 or control unit 52 are used to trigger another alert signal in IC 20. The output in question may, for example, manipulate parity protected registers and busses to deliberately cause a parity error, thereby leveraging on other existing security countermeasures in the IC.

In an embodiment, at least one of the sampling points sensed by sensors 48 or control unit 52 is connected to non-leaf traces in the high-fanout network. In another embodiment, sensor 48 and/or control unit 52 are set to detect a change, a glitch or an active level in at least one of their inputs. Note that a glitch may refer to a change in signal voltage or current from one level to another and back within a short period of time.

In yet another embodiment, sensor 48 and/or control unit 52 receive inputs from at least one other detection mechanism in the IC. In another embodiment, control unit or a sensor 48 modifies the signal level on network root 40 or on another branch of the high-fanout network (e.g., forces the signal to active) due to an assertion of an ALERT signal, e.g., resulting from the high-fanout network detectors or other attack detectors embedded in the device.

Fault Injection Detection Using Existing High-Fanout Network

In some embodiments of the present invention, control unit 52 uses the outputs of sensors 48 to detect fault injection attacks applied to IC 20. Various types of attacks can be identified, e.g., attacks conducted by physically contacting a line in IC 20, by applying an electromagnetic field to the IC, by applying laser pulses, by applying a disturbance to a power supply line or other external interface of the IC, or any other suitable kind of fault injection attack. Any such action is meant to cause a glitch or disturbance on one or more of the lines in IC 20.

Typically, control unit 52 detects fault injection attempts by detecting a signal abnormality at one or more of the sampling points on the high-fanout network. In the context of the present patent application and in the claims, the term "signal abnormality" refers to any kind of deviation of the signal (e.g., voltage or current) from its expected baseline form or behavior, e.g., its expected level or temporal waveform, with relation to its own behavior and/or to the relation between it and other signals. Such an abnormality may be, for example, due to a glitch caused by a fault injection attempt, due to a mismatch between two branches (sampling points) of the same network, or due to an unexpected branch voltage level or transition.

In some embodiments, control unit 52 applies certain logic or criteria to the outputs of sensors 48, in order to provide sensitive detection of fault injection attempts and reduce the probability of false detections. The criteria used by control unit 52 depend on the characteristics of the high-fanout network chosen to serve for fault injection detection. As noted above, in some embodiments the high-fanout network distributes a signal that is continuously and unconditionally inactive during normal functional operation of the IC. One example is a scan-enable or scan-shift signal. Alternatively, the high-fanout network may distribute a signal that varies over time during normal functional operation of the IC. One example is an active-shield signal.

Regardless of the high-fanout network type, an inconsistency between the network branches may indicate a fault injection. In other cases, the logic for detecting signal abnormality may differ from one type of high-fanout network to another. In a slow-toggling rate network, for example, a transition from logic "0" to "1" and immediately back to "0" is highly abnormal and may be indicative of a fault injection attempt.

In a reset network, for example, regardless of the reset state (active or inactive), an inconsistent network state while not during network transition, for example, where at least one network branch has a different level than at least one other network branch, is highly abnormal and may be indicative of a fault injection attempt. In a scan enable network, for example, an assertion of at least one of the network branches during normal operation (non-test) mode is highly abnormal and may be indicative of a fault injection attempt. Note that it is a common practice to disable test modes in security related ICs. Therefore, having the detection mechanism off in test modes like scan mode is typically not considered a threat.

As another example, control unit 52 or sensor 48 may detect suspected fault injection attempts by comparing some of the sensor outputs to one another. Under normal conditions, all sensors are expected to sense a similar signal level. A difference in sensed signal level between sensors, which is not part of legitimate network transition or maintained for more than a transitive period, may be indicative of fault injection. In an example embodiment, control unit 52 compares the outputs of two or more sensors that sense network leaves 44, i.e., the signals provided to FFs 24. Note that this sort of comparison can also be performed when the signal over the network is not fixed (may legitimately change over time). Also note that branches which are not directly connected to FFs 24 can be connected to sensor 48 or directly to control unit 52.

In another embodiment, control unit 52 or sensor 48 is configured to detect glitches in at least one of its inputs. Note that this sort of detection can also be performed when the signal over the network is not fixed (may legitimately change over time). This technique enables the control unit to detect glitches on any signal or network which is guaranteed not to have glitches under normal operating condition. An example of such networks and signals are those driven directly by a flip-flop output.

Typically, control unit 52 carries out fault injection detection during normal operation of IC 20, and in particular during normal operation of the high-fanout network. In other words, the normal signal that is distributed by the high-fanout network (e.g., scan enable signal or active-shield signal) is not controlled or inhibited, and the network is not switched into any dedicated detection mode. Fault injection detection during normal operation is important because it provides protection at the time it is needed the most—during normal manipulation of data in the IC. Moreover, detecting fault injection during normal operation eliminates the need for additional mode-switching circuitry and/or software.

In some embodiments, the signal level on the high-fanout network is not entirely constant, but rather slowly varying or slowly toggling. This behavior occurs, for example, in an active-shield network that distributes a shield voltage or current over a conducting layer disposed above the IC circuitry. In such an embodiment, since the normal signal is slowly varying or slowly toggling, control unit 52 is able to detect transient or rapidly-varying signals on the high-fanout network, which may indicate a fault injection attack.

Thus, in some embodiments, control unit 52 senses the sensor outputs and detects fault injection attempts during time intervals in which the normal signal on the high-fanout network is expected to be stable (i.e., constant, or at least varying at less than a predefined rate). The types of high-fanout networks described above are depicted purely by way of example.

In alternative embodiments, the disclosed techniques can be implemented using any other suitable high-fanout network. Typically, although not necessarily, the signal distributed by the high-fanout network is asynchronous (as opposed to data signals that are typically sampled by a clock signal).

In some embodiments, one or more of buffers 32 in the high-fanout network are designed to have a particularly high sensitivity for transitioning to the active state, and a lower sensitivity for transitioning to the inactive state. This imbalanced design increases the likelihood that a glitch caused by fault injection will propagate over the high-fanout network and will be captured by one or more of sensors 48.

Consider, for example, an active-low high-fanout network, in which a certain buffer 32 has low-driving transistor path (for transitioning to the active state) and a high-driving transistor path (for transitioning to the inactive state). In an embodiment, the low-driving transistor path may be designed to be faster and stronger than the high-driving transistor path. Alternatively, any other suitable imbalanced design can be used. Moreover, the present example refers to a buffer 32, but the disclosed imbalanced design technique can be used with various other electronic components that are inserted in the high-fanout network, such as inverters or repeaters.

Figure 2:
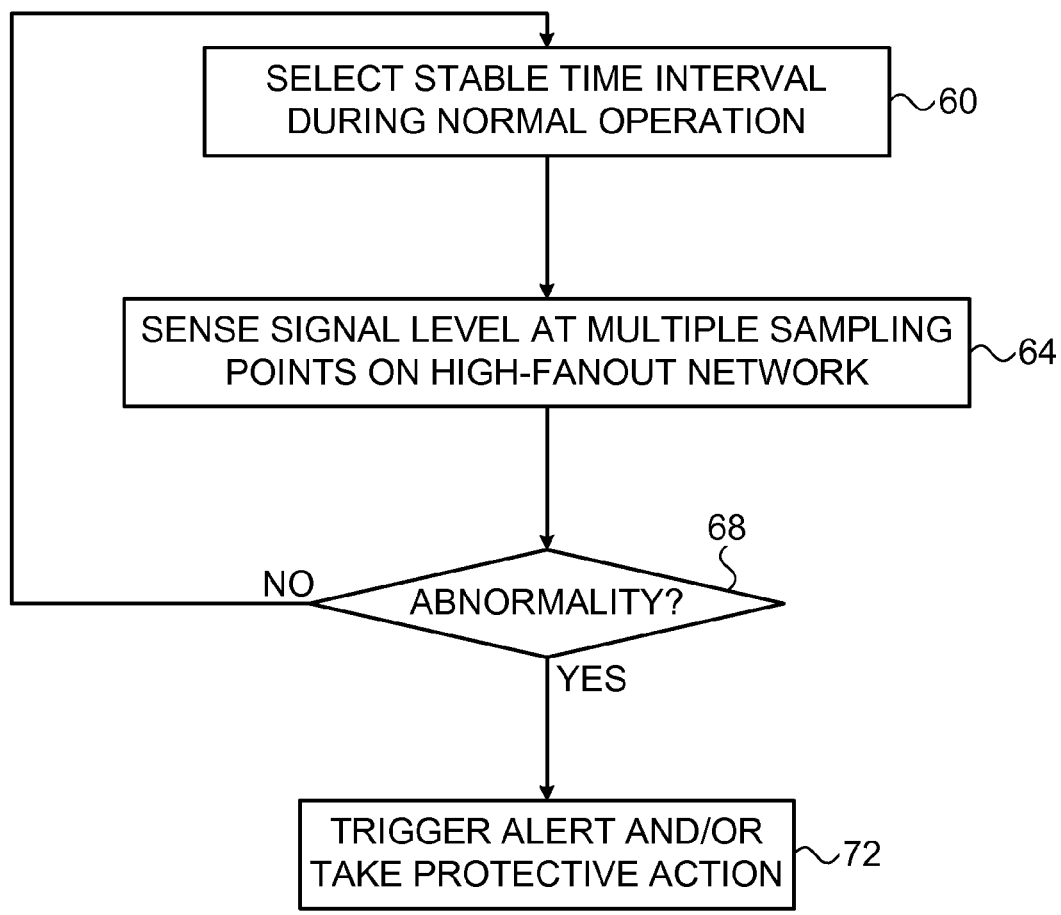
FIG. 2 is a flow chart that schematically illustrates a method for detecting fault injection, in accordance with an embodiment of the present invention.

FIG. 2 is a flow chart that schematically illustrates a method for detecting fault injection, in accordance with an embodiment of the present invention. The method begins at a time selection step 60, with control unit 52 selecting a time interval in which the normal signal on the high-fanout network is expected to be stable and/or consistent. Note that for some network types, such as scan enable networks, this condition is always met during normal operating mode.

At a sensing step 64, control unit 52 senses the outputs of sensors 48. In other words, the control unit senses the high-fanout network at multiple sampling points. At an abnormality checking step 68, control unit 52 checks whether signal abnormality is found at one or more of the sampling points.

If an abnormality is detected, control unit 52 triggers an alert or takes some protective action to mitigate the suspected fault injection attempt, at a reaction step 72. Otherwise, the method loops back to step 60 above.

Although the embodiments described herein mainly address integrated circuit protection against fault injection, the methods and systems described herein can also be used in other applications, such as in fault injection detection in distributed circuits, e.g., by monitoring interconnecting signals on board, and for functional failures detection in both distributed and integrated circuits.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. Apparatus for detecting fault injection, comprising:
a signal network, which is configured to distribute, to multiple components at multiple locations in an Integrated Circuit (IC), a logic signal that is continuously inactive during functional operation of the IC;
an electronic component, which is inserted in the signal network and which comprises (i) a first transistor path for transitioning to an inactive state and (ii) a second transistor path for transitioning to an active state; and
circuitry, which is configured to sense respective levels of the logic signal at multiple sampling points in the signal network, to compare two or more of the levels of the logic signal, sensed at two or more of the sampling points, to one another, and to identify a fault injection attempt by detecting a difference between the compared levels of the logic signal,
wherein, due to the second transistor path of the electronic component having a higher transitioning sensitivity than the first transistor path, the electronic component causes a higher likelihood, relative to balanced-sensitivity transistor paths, that a glitch caused by the fault injection attempt will propagate through the signal network and will be identified by the circuitry.

2. The apparatus according to claim 1, wherein the signal network comprises a test signal network.

3. The apparatus according to claim 1, wherein the circuitry comprises at least one sensor that is configured to sense the levels in at least two of the sampling points, and to consolidate the sensed levels so as to produce a respective sensor output.

4. The apparatus according to claim 1, wherein the circuitry is configured to continuously sense the levels and identify the fault injection attempt while the IC operates in a normal operation mode.

5. The apparatus according to claim 1, wherein the circuitry is configured to receive at least one input from other detection logic in the IC.

6. The apparatus according to claim 1, wherein, in response to identifying the fault injection attempt, the circuitry is configured to provide at least one output to another alert mechanism in the IC.

7. The apparatus according to claim 1, wherein, in response to identifying the fault injection attempt, the circuitry is configured to modify one or more of the levels in the signal network.

8. Apparatus for detecting fault injection, comprising:
a signal network, which is configured to distribute a logic signal to multiple components at multiple locations in an Integrated Circuit (IC);
an electronic component, which is inserted in the signal network and which comprises (i) a first transistor path for transitioning to an inactive state and (ii) a second transistor path for transitioning to an active state; and
circuitry, which is configured to sense respective levels of the logic signal at multiple sampling points in the signal network, to compare two or more of the levels of the logic signal, sensed at two or more of the sampling points, to one another, to distinguish between legitimate variations and signal abnormalities in the signal network by detecting a difference between the compared levels of the logic signal during functional operation of the IC, and to identify a fault injection attempt by detecting a signal abnormality,
wherein, due to the second transistor path of the electronic component having a higher transitioning sensitivity than the first transistor path, the electronic component causes a higher likelihood, relative to balanced-sensitivity transistor paths, that glitches caused by the signal abnormalities will propagate through the signal network and will be identified by the circuitry.

9. The apparatus according to claim 8, wherein the circuitry comprises at least one sensor that is configured to sense the levels in at least two of the sampling points, and to consolidate the sensed levels so as to produce a respective sensor output.

10. The apparatus according to claim 8, wherein the circuitry is configured to identify one or more time intervals during which the levels in the signal network are expected to be stable, and to detect the signal abnormality only during the identified time intervals.

11. The apparatus according to claim 8, wherein the circuitry is configured to receive at least one input from other detection logic in the IC.

12. The apparatus according to claim 8, wherein, in response to identifying the fault injection attempt, the circuitry is configured to provide at least one output to another alert mechanism in the IC.

13. The apparatus according to claim 8, wherein, in response to identifying the fault injection attempt, the circuitry is configured to modify one or more of the levels in the signal network.

14. The apparatus according to claim 8, wherein the circuitry is configured to detect the signal abnormality by detecting a glitch on at least one of the sensed levels.

15. A method for detecting fault injection, comprising:
sensing respective levels of a logic signal at multiple sampling points in a signal network, which distributes the logic signal to multiple components at multiple locations in an Integrated Circuit (IC) and which is continuously inactive during functional operation of the IC, wherein the signal network comprises an electronic component, which comprises (i) a first transistor path for transitioning to an inactive state and (ii) a second transistor path for transitioning to an active state;

comparing two or more of the levels of the logic signal, sensed at two or more of the sampling points, to one another; and identifying a fault injection attempt by detecting a difference between the compared levels of the logic signal, wherein, due to the second transistor path of the electronic component having a higher transitioning sensitivity than the first transistor path, the electronic component causes a higher likelihood, relative to balanced-sensitivity transistor paths, that a glitch caused by the fault injection attempt will propagate through the signal network and will be identified by the circuitry.

16. A method for detecting fault injection, comprising:

sensing respective levels of a logic signal at multiple sampling points in a signal network that distributes the logic signal to multiple components at multiple locations in an Integrated Circuit (IC), wherein the signal network comprises an electronic component, which comprises (i) a first transistor path for transitioning to an inactive state and (ii) a second transistor path for transitioning to an active state;

comparing two or more of the levels of the logic signal, sensed at two or more of the sampling points, to one another;

distinguishing between legitimate variations and signal abnormalities in the signal network by detecting a difference between the compared levels of the logic signal during functional operation of the IC; and identifying a fault injection attempt by detecting a signal abnormality, wherein, due to the second transistor path of the electronic component having a higher transitioning sensitivity than the first transistor path, the electronic component causes a higher likelihood, relative to balanced-sensitivity transistor paths, that glitches caused by the signal abnormalities will propagate through the signal network and will be identified by the circuitry.

17. The apparatus according to claim 1, wherein the circuitry is configured to identify the fault injection attempt by detecting a signal that toggles from a first logic level to a second logic level and back to the first logic level more rapidly than the logic signal.

18. The apparatus according to claim 8, wherein the circuitry is configured to distinguish between the legitimate variations and the signal abnormalities by detecting the signal abnormality that toggles from a first logic level to a second logic level and back to the first logic level more rapidly than the logic signal.

* * * * *